(12) United States Patent
Greenlaw

(10) Patent No.: US 6,943,067 B2
(45) Date of Patent: Sep. 13, 2005

(54) THREE-DIMENSIONAL INTEGRATED SEMICONDUCTOR DEVICES

(75) Inventor: David Greenlaw, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/260,840

(22) Filed: Sep. 30, 2002

(65) Prior Publication Data

US 2003/0129829 A1 Jul. 10, 2003

(30) Foreign Application Priority Data

Jan. 8, 2002 (DE) ........................................ 102 00 399

(51) Int. Cl.[7] .............................................. H01L 21/00
(52) U.S. Cl. ..................................................... 438/152
(58) Field of Search ................................ 438/152, 153, 438/618

(56) References Cited

U.S. PATENT DOCUMENTS

| | | | | |
|---|---|---|---|---|
| 4,489,478 A | * | 12/1984 | Sakurai | 438/18 |
| 5,128,732 A | * | 7/1992 | Sugahara et al. | 257/353 |
| 5,324,980 A | * | 6/1994 | Kusunoki | 257/74 |
| 5,563,084 A | | 10/1996 | Ramm et al. | 437/51 |
| 6,075,268 A | * | 6/2000 | Gardner et al. | 257/327 |
| 6,420,730 B1 | * | 7/2002 | Gardner et al. | 257/67 |

FOREIGN PATENT DOCUMENTS

| | | |
|---|---|---|
| DE | 3586732 | 4/1993 |
| DE | 4427516 | 2/1996 |
| DE | 19543540 | 11/1996 |
| DE | 19849586 | 5/2000 |
| EP | 0 374 971 | 6/1990 |
| EP | 0 703 619 | 3/1996 |
| WO | WO93/16491 | 8/1993 |

OTHER PUBLICATIONS

Patent Abstracts of Japan, Publication No. 2001326326 (Nov. 22, 2001).
Patent Abstracts of Japan, Publication No. 2001237370 (Aug. 31, 2001).
Patent Abstracts of Japan, Publication No. 2001160612 (Jun. 12, 2001).
Keyes, "Fundamental Limits in Digital Information Processing," *Proceedings of the IEEE*, 69:267–78, 1981.

* cited by examiner

*Primary Examiner*—David Nelms
*Assistant Examiner*—Quoc Hoang
(74) *Attorney, Agent, or Firm*—Williams, Morgan & Amerson, P.C.

(57) ABSTRACT

The present invention describes a process for three-dimensional integration of semiconductor devices and a resulting device. The process combines low temperature wafer bonding methods with backside/substrate contact processing methods, preferably with silicon on insulator devices. The present invention utilizes, in an inventive fashion, low temperature bonding processes used for bonded silicon on insulator (SOI) wafer technology. This low temperature bonding technology is adopted for stacking several silicon layers on top of each other and building active transistors and other circuit elements in each one. The back-side/substrate contact processing methods allow the interconnection of the bonded SOI layers.

59 Claims, 9 Drawing Sheets

THREE-DIMENSIONAL INTEGRATED SEMICONDUCTOR DEVICES

BACKGROUND OF THE INVENTION

1. Field of the Invention

The present invention relates to the field of fabrication of integrated circuits, and, more particularly, to semiconductor structures wherein integrated circuits are stacked on top of each other to allow vertically integrated circuits.

2. Description of the Related Art

Throughout the evolution of integrated circuits, it has been realized that the need for improvements can be focused on two items: (1) increasing the functional complexity of the circuits, whereby the device area should decrease; and (2) increasing the circuit speed, allowing an overall improvement of the circuit performance. With regard to the increase in functional complexity, this results mainly in an increase in functional density, while at the same time the shrinking size of chip structures is also of importance. The functional density, which is of primary importance, is defined as the number of interconnected devices per chip area. In contrast to this, the number of devices per chip area is referred to as the device density.

Improvements in the technology of integrated circuits steadily allow an increasing device density. However, the area which is occupied by the interconnection lines between the on-chip devices grew more quickly, as exemplified below, such that the condition was reached in which the functional density, and therefore the chip area, became interconnect-limited. This means that the shrinking of device structures does not lead to an increase in functional density, and would, therefore, not lead to an improved circuit performance. The following simplified example illustrates the limitation of the functional density due to device interconnections.

Assuming that five devices have to be completely interconnected with each other, such that every device is connected to each and every other device, in this case ten interconnection lines are required. Further assuming that the five devices occupy the same area as the interconnection lines, the interconnection lines will consequently occupy half (50%) of the total chip area.

When looking at a second case where ten devices should be interconnected, a complete interconnection between each of the devices, such that every device is connected to each and every other device, would require 45 connection lines. This means that when the area of the devices is doubled, the area of the connection lines increases by a factor of 4.5, provided that every connecting line has the same length. While in the first case the area of the interconnection lines occupies half of the chip area, in the latter case it occupies approximately two-thirds of the chip area.

As a result, with increasing device density, the share in total area of the area occupied by interconnection lines increases. For example, in *Proceedings of the IEEE*, Vol. 69, p. 267, 1981, a report on a case of a bipolar chip comprising 1,500 gates fabricated on a chip area of 0.29 $cm^2$ using single level metal (horizontal interconnection) with a pitch of 6.5 $\mu m$ cited the total area of the connection wires as 0.26 $cm^2$, which is approximately nine-tenths of the surface area of the chip. Consequently, there exists a limitation point where an additional device element would require as much additional area of interconnection lines that the functional density would decrease although the structure size decreases.

One approach to overcome this limitation due to the complexity of the interconnection between devices on one chip level is to introduce multi-level interconnect technology, whereby more than one circuit level is interconnected vertically such that the complexity in one level can be reduced.

With regard to improvement in circuit performance by increasing circuit speed, there are also limitations due to the switching speed of MOS transistors and the propagation delay in the interconnect wires. At the currently used device dimensions, however, the switching speed of the MOS transistor itself does not limit the logic delay of the integrated circuit (IC). In other words, as the devices shrink, the device contribution to the propagation delay also decreases. Scaling down interconnection line widths, however, necessarily increases the propagation delay time due to the increasing resistance and parasitic capacitance. Since the propagation delay time is further influenced by the interconnection path length, and since the interconnection path lengths also increase with the functional density, the circuit speed becomes interconnect propagation delay time-limited.

In view of this, an interconnecting technology between different levels would allow reduction of interconnection complexity in one level and would, therefore, increase the functional density. The length of connecting lines within one level, as well as optimization of the rooting of the interconnect lines, would reduce parasitic capacitance, resistance and signal cross-talk. This results in an overall increase in the system speed.

A multi-layered structure with vertical interconnections is described, for example, in U.S. Pat. No. 5,793,115. Each circuit layer described in this patent can be fabricated in a separate wafer or thin film material and subsequently transferred onto the layered structure and interconnected. In particular, this document describes a microprocessor divided into functional blocks, for instance an arithmetic logic unit (ALU), a controller, memory elements, etc., which are fabricated in the same or separate semiconductor wafers and then stacked. Typically, the functional blocks communicate with one another using address, data and control buses. These buses consist of a number of metal wires that are routed along the surface of a silicon chip. Typically, the metal wires run in areas of the chip between the functional blocks and take up a considerable amount of real estate, as much as half of that available. The functional blocks of the circuit are divided into two or more sections with one section of the circuit on a bulk chip and the remaining blocks on an overlaying thin film with components electrically connected through an intervening insulating layer. The circuits may be formed in silicon on insulator (SOI) structures and are mounted together by using epoxy. Interconnections are formed with an epoxy which is electrically and thermally conductive.

However, the two wafers are combined via an epoxy layer, which has disadvantages with regard to electrical insulation and stability compared to insulation materials like silicon dioxide. Moreover, the contact vias are filled with an electrically and thermally conductive epoxy, exhibiting poorer conductivity compared to a metallic connection. Consequently, only a low aspect ratio (depth/width) of the contact vias can be achieved.

Another approach to achieve a vertical integration is described by Ruth DeJule in Semiconductor International in November 1999. There, a three-dimensional SOI structure using epitaxial lateral overgrowth is described. In this process, layers of silicon on insulator are created by forming oxide wells, thermally grown to a thickness of about 300 nm, followed by a lithography step to define islands. The oxide is etched by reactive ion etching. Using low pressure chemical vapor deposition (LPCVD), silicon epitaxial layers are grown selectively (selective epitaxial growth, SEG), seeded through oxide windows that pick up the atomic template from a substrate or from an SOI island on a preceding layer. At the top edge of the window, growth continues laterally, filling adjacent recessed wells to a maximum distance of 20–50 µm at growth rates of 0.11 µm/minute. The location of the SEG windows, whereby the distance therebetween is as narrow as 200 nm, is defined lithographically.

The disadvantage of this process is that each preceding layer is exposed to the process conditions of the currently processed layer. This means that for the formation of a device with stacked layers, a completely new process scheme has to be developed which carefully avoids the interference of process steps with underlying layers. Typically, corresponding processes may not be compatible with any established process in a chip plant and are, therefore, extremely cost-intensive.

Although the state of the art teaches processes for vertical integration, it is desirable to provide a process for stacking and interconnecting silicon on insulating layers leading to more reliable vertical integrated circuits, thereby only necessitating a minimum of process steps for fusing and interconnecting the silicon on insulator layers, whereby the influence of this process on the already processed circuits in the silicon on insulator films is minimized.

The present invention is directed to a method that may solve, or at least reduce, some or all of the aforementioned problems.

SUMMARY OF THE INVENTION

According to one embodiment of the present invention, a method of forming a three-dimensional integrated semiconductor device is provided. The method comprises providing a first device member, wherein the first device member comprises a first circuit element formed at least partially in a first semiconductor film. The semiconductor film is formed as a semiconductor island surrounded by insulating material, a first contact portion, and a first planar insulating layer of dielectric material having a first free surface. The method further comprises providing a second device member, wherein the second device member comprises a second circuit element formed at least partially in a second semiconductor film and a second planar insulating layer of dielectric material formed on the second semiconductor film having a second free surface. Additionally, the method comprises stacking the first and second device members on top of each other such that the first free surface of said first planar insulating layer faces the second free surface of said second planar insulating layer. Subsequently, the first planar insulating layer and the second planar insulating layer are bonded together, and a second contact portion is formed, wherein the second semiconductor layer extends through the second device member, the second semiconductor layer, the second planar insulating layer and the first planar insulating layer to the first contact portion.

According to another embodiment of the present invention, a method of forming a three-dimensional integrated semiconductor device is provided. The method comprises providing a first semiconductor circuit element, wherein the first semiconductor circuit element comprises a first contact portion and a first planar insulating layer of dielectric material covering the first semiconductor circuit element and the first contact portions and having a first free surface. The method further comprises providing a second semiconductor circuit element formed on a second planar insulating layer of dielectric material having a second free surface. Additionally, the method comprises stacking the first and the second semiconductor circuit elements on top of each other such that the first free surface of the first planar insulating layer faces the second free surface of the second planar insulating layer. Afterwards, the first planar insulating layer and the second planar insulating layer are bonded together, and a second contact portion is formed, wherein the second semiconductor layer extends through the second semiconductor circuit element, the second planar insulating layer and the first planar insulating layer to a first contact portion by etching a via having an aspect ratio greater than 10 and filling it with conductive material.

According to yet another embodiment of the present invention, a method of forming a three-dimensional integrated semiconductor device is provided. The method comprises providing a first semiconductor device element, whereby the first semiconductor device element comprises at least two circuit elements stacked on top of each other and fused together, a first contact portion and a first planar insulating layer of dielectric material having a first free surface. The method further comprises providing a second semiconductor device element formed on a second planar insulating layer of dielectric material having a second free surface. Additionally, the method comprises stacking the first and the second semiconductor device elements on top of each other such that the first free surface of the first planar insulating layer faces the second free surface of the second planar insulating layer. Thereafter, the first planar insulating layer and the second planar insulating layer are bonded together and a second contact portion is formed extending through the second semiconductor device element, the second planar insulating layer and the first planar insulating layer to the first contact portion by etching at least one via having an aspect ratio greater than 10 and filling it with conductive material.

According to yet another embodiment of the present invention, a method of forming a three-dimensional integrated semiconductor device is provided. The method comprises providing a first semiconductor film with a first planar insulating layer of dielectric material having a first free surface and providing a second semiconductor film with a second planar insulating layer of dielectric material having a second free surface. Additionally, the method comprises stacking the first and the second semiconductor film on top of each other such that the first free surface of the first planar insulating layer faces the second free surface of the second planar insulating layer and such that the first and the second semiconductor films are separated by the first and second planar insulating layers. The method further comprises bonding the first planar insulating layer and the second planar insulating layer together. Additionally, the method comprises forming a circuit element at least partially in each of said first and second semiconductor films, and forming a contact portion by etching a via having an aspect ratio greater than 10 and filling it with conductive material interconnecting the first circuit element of the first semiconductor film with the second circuit element of the second semiconductor film.

According to a further embodiment of the present invention, a three-dimensional integrated semiconductor device is provided. The device comprises a first device member, wherein the first device member comprises a first circuit element formed at least partially in a first semiconductor film, wherein said semiconductor film is formed as a semiconductor island surrounded by insulating material, a first contact portion, and a first planar insulating layer of dielectric material having a first free surface. The device further comprises a second device member, wherein the second device member comprises a second circuit element formed at least partially in a second semiconductor film and a second planar insulating layer of dielectric material formed on the second semiconductor film having a second free surface. The first and the second device members are stacked on top of each other such that the first free surface of the first planar insulating layer faces the second free surface of the second planar insulating layer. The first planar insulating layer and the second planar insulating layer are bonded together, and a second contact portion extends through the second device member, the second semiconductor layer, the second planar insulating layer and the first planar insulating layer to the first contact portion.

According to yet a further embodiment of the present invention, a three-dimensional integrated semiconductor device is provided. The device comprises a first semiconductor circuit element, wherein the first semiconductor circuit element comprises a first contact portion and a first planar insulating layer of dielectric material covering the first semiconductor circuit element and the first contact portions and having a first free surface. The device further comprises a second semiconductor circuit formed on a second planar insulating layer of dielectric material having a second free surface. The first and the second semiconductor circuit elements are stacked on top of each other such that said first free surface of said first planar insulating layer faces said second free surface of said second planar insulating layer. The first planar insulating layer and the second planar insulating layer are bonded together, and a second contact portion extending through said second semiconductor circuit element, said second planar insulating layer and said first planar insulating layer to a first contact portion, said second contact portion is a via filled with metal and having an aspect ratio greater than 10.

According to another embodiment of the present invention, a three-dimensional integrated semiconductor device is provided. The device comprises a first semiconductor device element, wherein the first semiconductor device element comprises at least two circuit elements stacked on top of each other and fused together and a first contact portion extending through the two fused circuit elements and a first planar insulating layer of dielectric material having a first free surface. The device further comprises a second semiconductor device element formed on a second planar insulating layer of dielectric material having a second free surface. The first and the second semiconductor device elements are stacked on top of each other such that the first free surface of the first planar insulating layer faces the second free surface of the second planar insulating layer. The first planar insulating layer and the second planar insulating layer are bonded together, and a second contact portion extends through the second semiconductor device element, the second planar insulating layer and the first planar insulating layer to a first contact portion whereby the second contact portion is a via filled with metal having an aspect ratio greater than 10.

According to yet another embodiment of the present invention, a three-dimensional integrated semiconductor device is provided. The device comprises a first silicon on insulator circuit element formed on a substrate wherein a second silicon on insulator circuit element is formed at least partially in said substrate and said first and second silicon on insulator circuit elements are interconnected.

BRIEF DESCRIPTION OF THE DRAWINGS

The invention may be understood by reference to the following description taken in conjunction with the accompanying drawings, in which like reference numerals identify like elements, and in which.

Figure 1A:
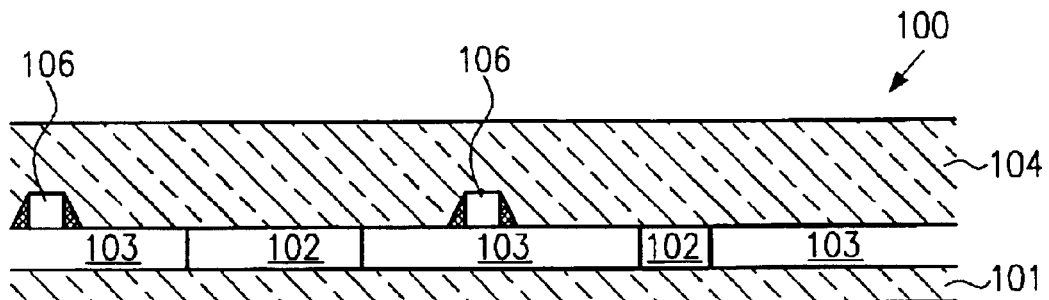
FIGS. 1a–1e illustrate a process for three-dimensional integration of semiconductor devices according to one illustrative embodiment of the present invention, whereby two semiconductor device elements were stacked on top of each other and interconnected.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention describes a process for three-dimensional integration of semiconductor devices and a resulting device. The process combines low temperature wafer bonding methods with backside/substrate contact processing methods, preferably with silicon on insulator devices.

The present invention utilizes in an inventive fashion low temperature bonding processes used for bonded silicon on insulator wafer technology. This low temperature bonding technology is adopted for stacking several silicon layers on top of each other and building active transistors and other circuit elements in each one.

The present invention further utilizes in an inventive fashion interconnection technology that is used to overcome an intrinsic disadvantage of silicon on insulator devices. More precisely, in a field effect transistor (FET) formed on a substrate having an insulating layer formed thereon, charge carriers are accumulating below the channel region of the FET. The accumulated charge carriers, however, will significantly affect the electrical characteristics of the transistor device, such as gate threshold voltage, and will lead to an undesired deterioration of signal performance. One possibility to remove the accumulated charge carrier is to provide the silicon on insulator devices with a substrate contact, wherein an electrical junction to the substrate is created. The formation of a contact, however, requires etching of high aspect openings through different materials and reliably filling these openings with a metal. The present invention adopts this complex interconnection technology in a way that allows the formation of both an inter-level connection as well as a substrate contact. As a result, the present invention provides a remarkably increased transistor density without increasing the chip area. Moreover, this invention will allow the stacking of semiconductor devices by using the same process methods as used in the fabrication of a single semiconductor device layer. Further, no additional process steps specialized for the three-dimensional integration of semiconductors are required.

With reference to FIGS. 1a–1e, an illustrative embodiment according to the present invention will now be described. FIG. 1a schematically shows a cross-sectional view of a second device member 100 according to the present invention. Second circuit elements 106 are formed at least partially in a second semiconductor film 103. The second semiconductor film 103 is formed on a second planar insulating layer 101 of dielectric material having a free surface 110. The second circuit elements 106 and the second semiconductor film 103 are covered by a protective layer 104.

In the illustrative embodiment of FIG. 1a, the second semiconductor film 103 is surrounded by insulating dielectric material 102/101 such that the second circuit elements 106 are formed at least partially in second semiconductor islands. Although the second semiconductor film 103 is not limited to second semiconductor islands, the same reference signs may be used for second semiconductor films 103 and second semiconductor islands 103.

The protective layer 104 may be silicon dioxide, silicon nitride, silicon carbide, sapphire and the like. The dielectric material of the second planar insulating layer 101 may be silicon dioxide, silicon nitride, silicon carbide, sapphire and the like and the semiconductor film 103 may be silicon, germanium, gallium arsenide and the like. Preferably, silicon dioxide is used provided in a tetraethyl orthosilicate (TEOS) process. The second circuit elements 106 may be active or passive elements such as field effect transistors (FET), capacitive elements, wiring elements and the like.

The above-mentioned structure is generally known as a silicon on insulator device if the second semiconductor film 103 is silicon. Silicon on insulator technology uses a simple fabrication sequence, provides reduced capacity of coupling between various circuit elements over the entire integrated circuit chip, and eliminates latch-up in CMOS circuits. Compared to standard technology like local oxidation of silicon (LOCOS), silicon on insulator technology allows smaller isolation areas and, therefore, reduces chip size. The minimum device separation is determined only by the limitations of lithography and not by the deposition process, as in LOCOS. Further, silicon on insulator technology allows an increased circuit speed due to the reduced parasitic capacitance and chip size. Examples for silicon on insulator processes will be described later.

As already mentioned before, the present invention is not limited to silicon on insulator devices. Insulation technologies for circuit elements may also be based on junction insulation techniques, "local oxidation of silicon" (LOCOS) techniques, trench insulation techniques and the like.

Figure 1B:
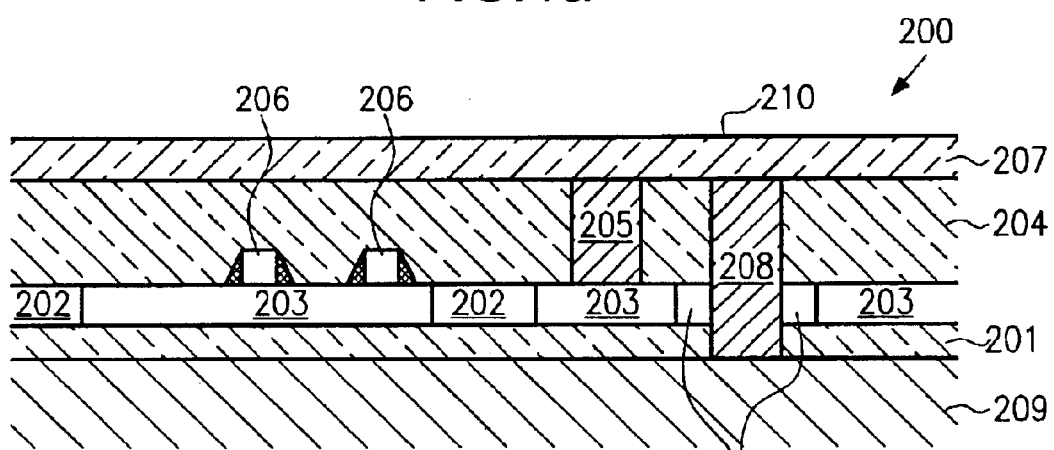

FIG. 1b is a cross-sectional view of a first device member 200. First circuit elements 206 are formed at least partially in a first semiconductor film 203. The first semiconductor film 203 is formed on an insulating layer 201. The first circuit elements 206 and the first semiconductor film 203 are covered by a protective layer 204. The first device member 200 further comprises first contact portions 205/208, a substrate 209 and a first planar insulating layer of dielectric material 207 covering the protective layer 204 and the first contact portions 205/208 and having a free surface 210. The protective layer 204, the dielectric material of the first planar insulating layer 201, the first semiconductor film 203 and the first circuit elements may comprise the same features as in the second device member 100 as described before.

In the illustrative embodiment of FIG. 1b, the first semiconductor film 203 is surrounded by insulating dielectric material 202/201 such that the first circuit elements 206 are formed at least partially in first semiconductor islands. Although the first semiconductor film 203 is not limited to first semiconductor islands, the same reference signs may be used for first semiconductor films 203 and first semiconductor islands 203.

Moreover, FIG. 1b shows the contact portions 205/208 enabling an electrical junction to the substrate 209 or to semiconductor islands 203. Such contact portions 205/208 may be used to remove charges in the region between the substrate 209 and the insulating layer 201. Due to the poor conductivity of these two layers, charges tend to accumulate in this region and deteriorate the device function. Therefore, a first contact portion may be used in silicon on insulator devices as substrate contacts 208. Typically, the contact portions 205/208 have a high aspect ratio (depth/width), preferably an aspect ratio (depth/width) larger than 10 and, in particular, preferably larger than 15.

The contact portions 205/208 may be formed in accordance with the following process flow. A lithography step is performed to provide a resist mask for a subsequent anisotropic etch step in order to form an opening for the contact portion 205/208. The anisotropic etch step for forming the opening does not need to exhibit any selectivity to any of the layers through which the opening is etched, e.g., the protective layer 204, the silicon island 203 and the insulating layer 201. The size and shape of the opening may be varied as a matter of design or choice and fill capabilities, i.e., the opening may have a circular, square or rectangular cross-sectional profile. In one illustrative embodiment, the opening is a generally circular opening having a diameter ranging from approximately 300–500 nm and may exceed a depth of more than 10 $\mu$m. In this case, the aspect ratio (depth/width) would be approximately 20 (10 $\mu$m/500 nm).

Next, the opening is filled by a contact metal such as tungsten. Any other appropriate contact metal known in the art, such as aluminum, cobalt, titanium, tantalum, or a combination thereof, may also be used. The deposition process may be chemical vapor deposition (CVD), sputtering, selective electroless metal deposition from aqueous solutions or any other process allowing sufficient step coverage.

Tungsten is, however, preferably used as filling material because it exhibits excellent resistance to electromigration effects, hillock formation, and humidity-induced corrosion.

Further, it can be deposited by means of CVD and thus allows much better step coverage than can be obtained by sputter deposited or physically evaporated films, for example aluminum films. As a consequence, contact openings, generally called vias, which have a very high aspect ratio (depth/width) can be filled, allowing a high circuit packing density.

In a particular embodiment, silicon dioxide is used as the dielectric material for the first planar insulating layer 207. Silicon dioxide technology is well-established and frequently used. A further advantage is that silicon dioxide as dielectric material for the first planar insulating layer 207 provides a surface for which well-established bonding processes exist.

In a further embodiment, the dielectric material of at least one of the planar insulating layers 201/207 is silicon dioxide deposited by chemical vapor deposition or plasma enhanced chemical vapor deposition. With these techniques, a better coverage of edges and structures with a high aspect ratio (depth/width) can be achieved. This is advantageous when using silicon on insulator technologies with small structure sizes. In such a way, a better compatibility to silicon on insulator processes can be achieved.

In yet another illustrative embodiment, the dielectric material of at least one of the planar insulating layers 201/207 is formed by decomposition of tetraethyl orthosilicate, generally known as TEOS, via chemical vapor deposition or plasma enhanced chemical vapor deposition. With such a process, high quality silicon dioxide films can be achieved having an excellent step coverage. Further, this method enables one to fill structures with a high aspect ratio (depth/width) which may be important for filling trenches with dielectric material in silicon on insulator processes.

Figure 1C:
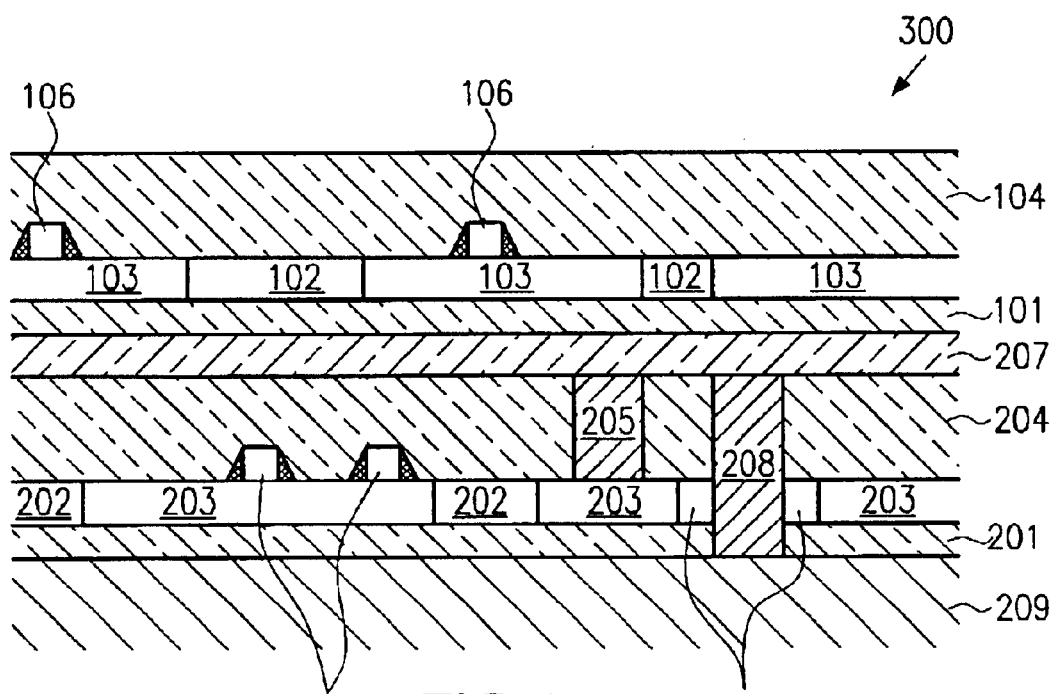

FIG. 1c shows a structure formed by fusing the device members of FIG. 1a and FIG. 1b. Features known from preceding figures keep their reference numbers. Any suitable bonding process known in the art may be used for fusing the device members of FIG. 1a and FIG. 1b. In one embodiment, a low temperature process may be selected, particularly a process requiring a temperature in the range from room temperature to approximately 500° C., and, more preferably, a temperature in the range from room temperature to approximately 300° C., to not adversely affect structures by elevated temperatures.

The bonding of structures as exemplified in FIGS. 1a and 1b may be formed in an exemplary fashion by the following process flow. Starting from two devices having silicon dioxide layers 207 and 101, the surfaces 110 and 210, respectively, are planarized and polished, for example by mechanical/chemical polishing. Next, the surfaces are activated by, for example, treatment with sulfuric acid and hydrogen peroxide, or by a plasma. Then, the polished surfaces 110 and 210 are brought into close contact under appropriate process conditions, that are at a temperature as described above, and atmospheric conditions may comprise vacuum conditions or conditions in an inert gas. Pressure conditions under which the devices are pressed together may range from no external pressure to more than 10 MPa.

Figure 1D:
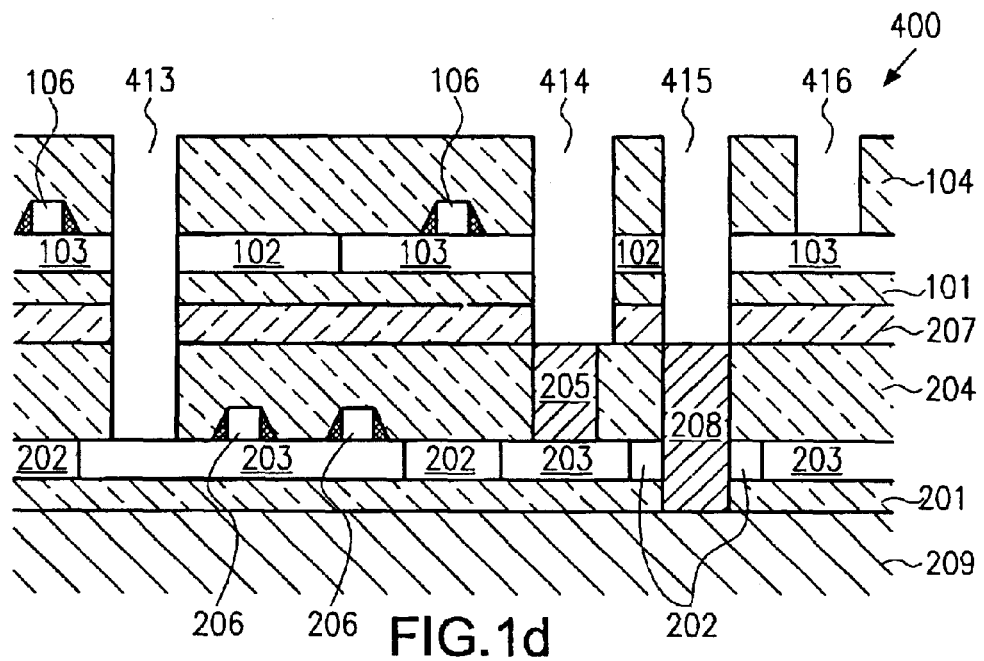

FIG. 1d illustrates the structure of FIG. 1c in an advanced manufacturing stage. Vias 413, 414, 415, 416 are etched into the device 400 down to several device levels, such as the first contact portions 205, 208 or to silicon islands 103, 203. The diameter of the vias 414 may be slightly larger than the underlying first contact portion 205 to facilitate positioning.

According to one illustrative embodiment, the same etch process as for the formation of the substrate contacts as previously described may be used. The vias 413, 414, 415, 416 may be etched down to a desired level in each of the structures as illustrated in FIGS. 1a and 1b. For example, the vias may be etched down to one of the first circuit elements 206 in the first device member 200, or down to one of the second circuit elements 106 in the second device member 100, or down to a contact portion 205, 208 in the first device member 200, or even down to the substrate 209 of the first device member 200. An anisotropic etch process may be used to achieve a high aspect ratio (depth/width).

Figure 1E:
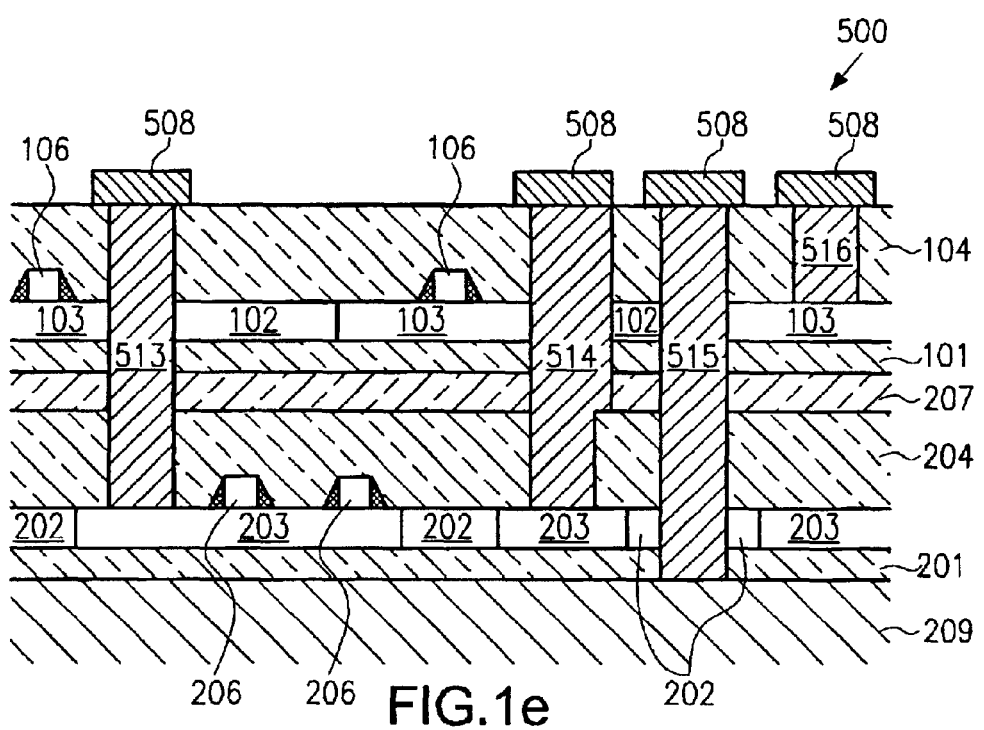

FIG. 1e is a cross-sectional view of a three-dimensional integrated semiconductor device 500 in a more advanced manufacturing stage. The vias 413, 414, 415, 416 of FIG. 1d are filled with conductive material to complete the process of forming such contact portions, providing a multi-level interconnection between stacked devices. The vias 413, 414, 415, 416 of FIG. 1d are filled by any appropriate contact metal known in the art, such as tungsten, aluminum, cobalt, titanium, tantalum or a combination thereof. The deposition process may be chemical vapor deposition (CVD), sputtering, selective electroless metal deposition from aqueous solutions and the like. Preferably, the process of filling the vias 413, 414, 415, 416 of FIG. 1d is, however, the same as that used for the substrate contacts as described previously. In one embodiment, the complete structure is provided with contact pads 508.

FIGS. 2 and 3 show illustrative examples for silicon on insulator wafer bonding methods. Silicon on insulator wafer bonding methods are reported to exhibit very low leakage currents as compared to various silicon on insulator approaches such as dielectric isolation (DI) and separation by implanted oxygen (SYMOX). For example, the dielectric isolation technique exhibits incompletely insulated islands, due to the thermal expansion coefficient differences of the materials used, resulting in a bowed wafer. SYMOX allows only thin buried oxide layers, being disadvantageous for higher voltage applications. Furthermore, according to the present invention, in silicon on insulator wafer bonding methods, the same bonding process as used for bonding the first and second device members 100 and 200 to form a three-dimensional semiconductor device may be employed. Therefore, the present invention enables applying compatible processes, and thus allows potentially avoiding process interferences.

In the following, the process steps for one illustrative example of a silicon on insulator wafer bonding method are explained with reference to the accompanying FIGS. 2a–2f. FIGS. 2a–2f are cross-sectional views of a silicon on insulator device, whereby different stages during the manufacturing process are illustrated. Although any kind of silicon on insulator process may be used, a particular illustrative embodiment employs silicon on insulator wafer bonding methods.

Figure 2A:
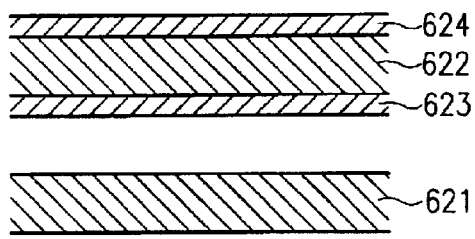
FIGS. 2a–2f illustrate a silicon on insulation technique based on wafer bonding which may be used in the present invention.

FIG. 2a shows the cross-sectional view of two wafers 621 and 622, whereby the first wafer 622 has oxidized surfaces 623 and 624 and may comprise doped or undoped silicon. The second wafer 621 may be a doped or undoped silicon substrate which may have oxidized surfaces or not. To be compatible with the processes previously described, however, an oxidized surface is preferred. Commercially available oxidized wafers may be utilized as first and/or second wafers 621, 622.

Figure 2B:
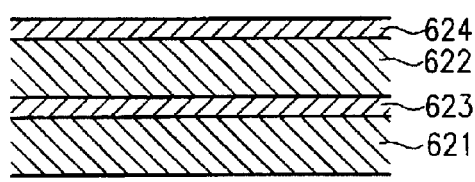

FIG. 2b shows the two wafers 621 and 622 fused after a bonding process. According to one embodiment, the bonding process is performed at a temperature between approximately 700–1200° C. The bonding process may be carried out under vacuum conditions and/or applying a voltage. A particular embodiment uses the same bonding process conditions as described before under FIG. 1c, particularly the same temperature conditions.

Figure 2C:
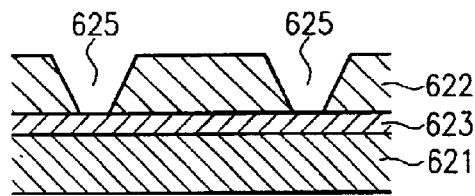

FIG. 2c illustrates a process stage wherein the covering oxide layer 624 has been removed and trenches 625 have been etched into the silicon 622. Any dry etch or wet chemical etch process known in the art may be used to remove the covering oxide layer 624. After a preceding photolithography step, as known in the art, the trenches 625 may be etched. The trenches 625 may be V-shaped, as shown in FIG. 2c, or more preferably have vertical walls to achieve a higher integration density.

Figure 2D:
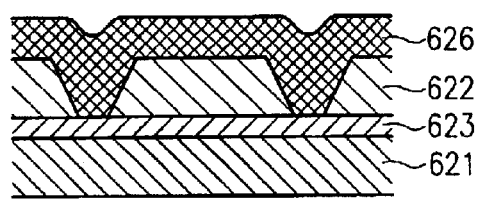

FIG. 2d illustrates a more advanced stage of the SOI process. The trenches 625 are filled with dielectric material, e.g., silicon dioxide 626. Alternatively, the surface of the trenches 625 may be oxidized again and a polysilicon film is formed on the oxide such that the remaining volume of the trench 625 is filled.

Figure 2E:
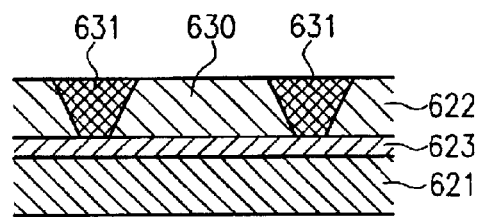

FIG. 2e exemplifies the result of a next process step. The device is planarized by removing protruding dielectric material such that silicon islands 630 are formed. The silicon islands 630 are surrounded by isolating material 623 and 631 and are isolated from neighboring silicon islands.

Figure 2F:
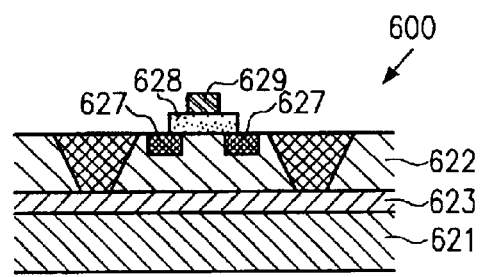

FIG. 2f shows an illustrative embodiment of a silicon on insulator device 600, wherein a field effect transistor having source and drain regions 627, a gate insulation layer 628 and a gate electrode 629 is formed at least partially in the silicon island 630.

In view of minimizing device structures, the trenches 625 may be anisotropically etched to achieve a high aspect ratio (depth/width). By this method, trenches with substantially vertical walls are obtained that are substantially filled with dielectric material. The processes, therefore, are preferably the same as already described. This process is similar to a process for forming a buried oxide (BOX).

Figure 3A:
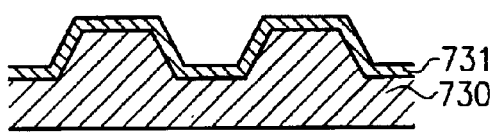
FIGS. 3a–3f illustrate a further silicon on insulation technique based on wafer bonding which may be used in the present invention.
Figure 3D:
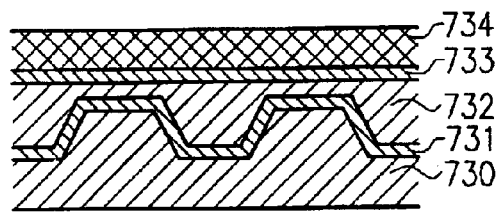
Figure 3B:
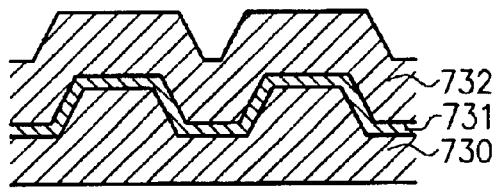
Figure 3E:
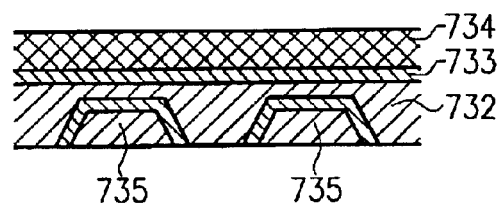
Figure 3C:
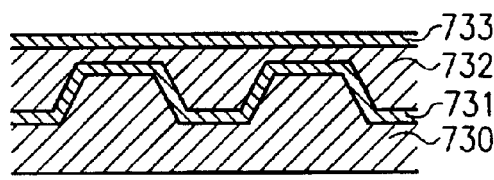
Figure 3F:
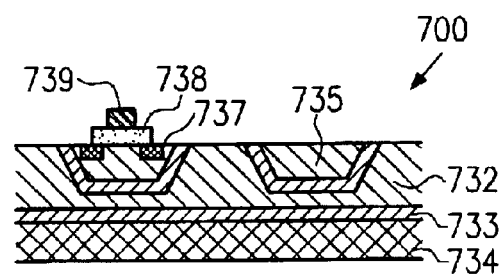

FIGS. 3a–3f show an alternative to the aforementioned silicon on insulator process. FIG. 3a shows a doped or undoped silicon material 730 in which V-shaped grooves have been etched and that is provided with an oxide layer 731. FIG. 3b depicts the next process step wherein polysilicon 732 is deposited on the oxidized layer 731. FIG. 3c illustrates a further advanced process stage wherein the polysilicon layer 732 is planarized and provided with an oxide layer 733. FIG. 3d exemplifies a next process step wherein a substrate wafer 734 is bonded to the oxide layer 733. Again, the same bonding processes as described before are preferred. FIG. 3e illustrates a further processed device wherein the silicon material 730 is thinned and polished until isolated silicon islands 735 are formed.

FIG. 3f again shows an illustrative embodiment of an SOI device 700 at the final step of forming circuits in the silicon islands 34, wherein a field effect transistor having source and drain regions 737, a gate insulation layer 738 and a gate electrode 739 is formed at least partially in the silicon island 735.

Figure 4A:
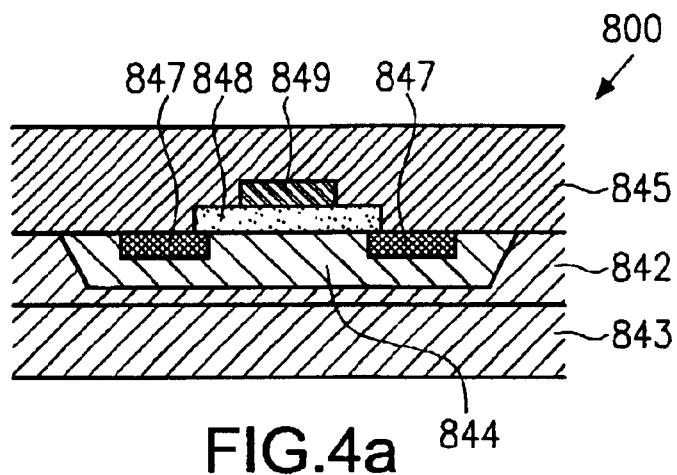
FIGS. 4a–4c illustrate a supporting technique for providing a second device according to one illustrative embodiment of the present invention.
Figure 4B:
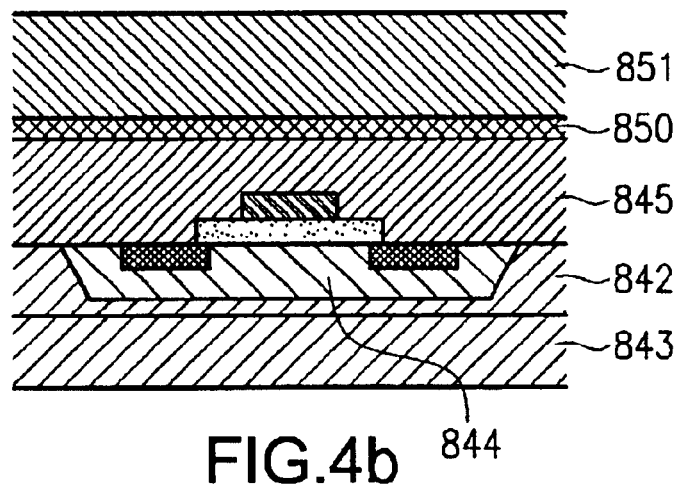
Figure 4C:
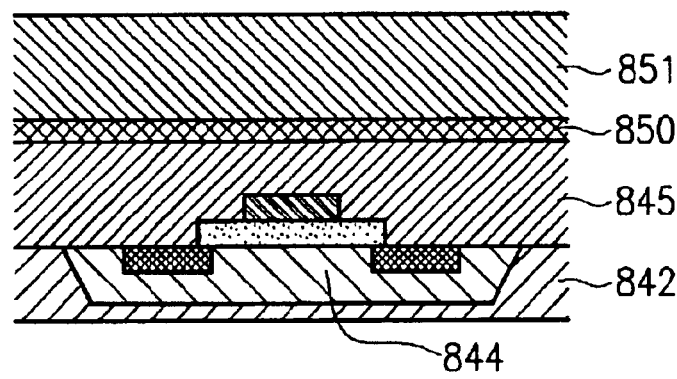

FIGS. 4a–4c illustrate a process for providing a second device member in a second semiconductor film as exemplified in FIG. 1a. Since silicon on insulator devices are, in general, provided with a substrate, immediate bonding to an underlying device is not possible. Therefore, such a substrate has to be removed. On the other hand, removing the substrate means dramatically removing the thickness of the device, whereby the mechanical stability gets lost. Therefore, a supporting process may be established to improve the mechanical stability during critical process steps that is exemplified in FIGS. 4a–4c.

FIG. 4a shows a cross-sectional view of a semiconductor device 800 that is intended to be bonded on a first semiconductor device 200 according to FIG. 1b. The semiconductor device 800 comprises a substrate 843, a protective layer 845 and a semiconductor island 844 surrounded by insulating material 842. A field effect transistor comprising source and drain regions 847, a gate insulation layer 848 and a gate electrode 849 is formed at least partially in the silicon island 844 and exemplifies a circuit element analogous to circuit elements 106 and 206 shown in FIG. 1. In order to bond the semiconductor device 800 to the first semiconductor device 200, according to FIG. 1b, the substrate 843 has to be removed, reducing the mechanical stability of the semiconductor device 800.

The cross-sectional view in FIG. 4b shows an auxiliary layer 851 attached to the protective layer 845 via an adhesion layer 850. The auxiliary layer 851 may be made of silicon, quartz or aluminum oxide, whereby the material may be chosen to exhibit a high degree of compatibility in view of thermal expansion and mechanical stability. Wax or an epoxy resin may be employed as adhesion layer 850 such that the auxiliary layer 851 can easily be removed.

The cross-sectional view of FIG. 4c illustrates the next process step. In this step, the substrate layer 843 is removed by a thinning process comprising chemical/mechanical polishing. A free surface of the insulating material 842 is formed that may be used to bond to an underlying first device member 200, such as described in FIG. 1c.

Before the next process step, according to a process which is illustrated in FIG. 1d can be performed, the auxiliary layer 851 and the adhesion layer 850 have to be removed in a preceding step. This can be done, for example, by heating the wax above its melting point, thereby removing the auxiliary layer 851.

FIGS. 5a–5e show an illustrative embodiment, wherein the formation of a three-dimensional integrated circuit 1100 is demonstrated having more than two semiconductor device members (I and II and III) stacked on top of each other. FIGS. 5a–5e illustrate an integrated circuit at various manufacturing stages.

Figure 5A:
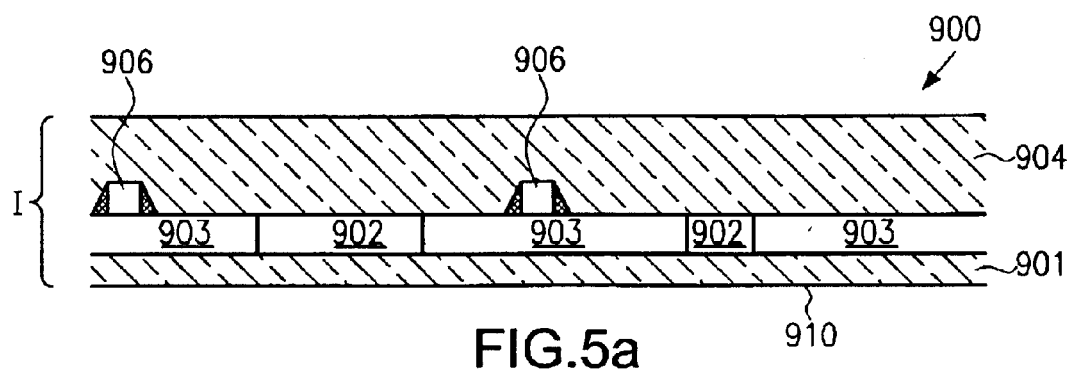
FIGS. 5a–5e illustrate a process for three-dimensional integration of semiconductor devices according to one illustrative embodiment of the present invention whereby more than two semiconductor device elements are stacked on top of each other and interconnected.

FIG. 5a schematically shows a cross-sectional view of a second device member 900 in a second semiconductor film 903 according to the present invention. The second semiconductor film 903 is formed on a second planar insulating layer of dielectric material 901 having a free surface 910. Circuit elements 906 are formed at least partially in the second semiconductor film 903. The circuit elements 906 and the second semiconductor film 903 are covered by a protective layer 904. The second semiconductor film 903 is surrounded by insulating material 901 and 902 forming a semiconductor island.

The structure of the second device member 900 in this illustrative embodiment is analogous to the second device member 100 of FIG. 1a and all features described with reference to FIGS. 1a–1e and corresponding embodiments apply to FIG. 5a.

Figure 5B:
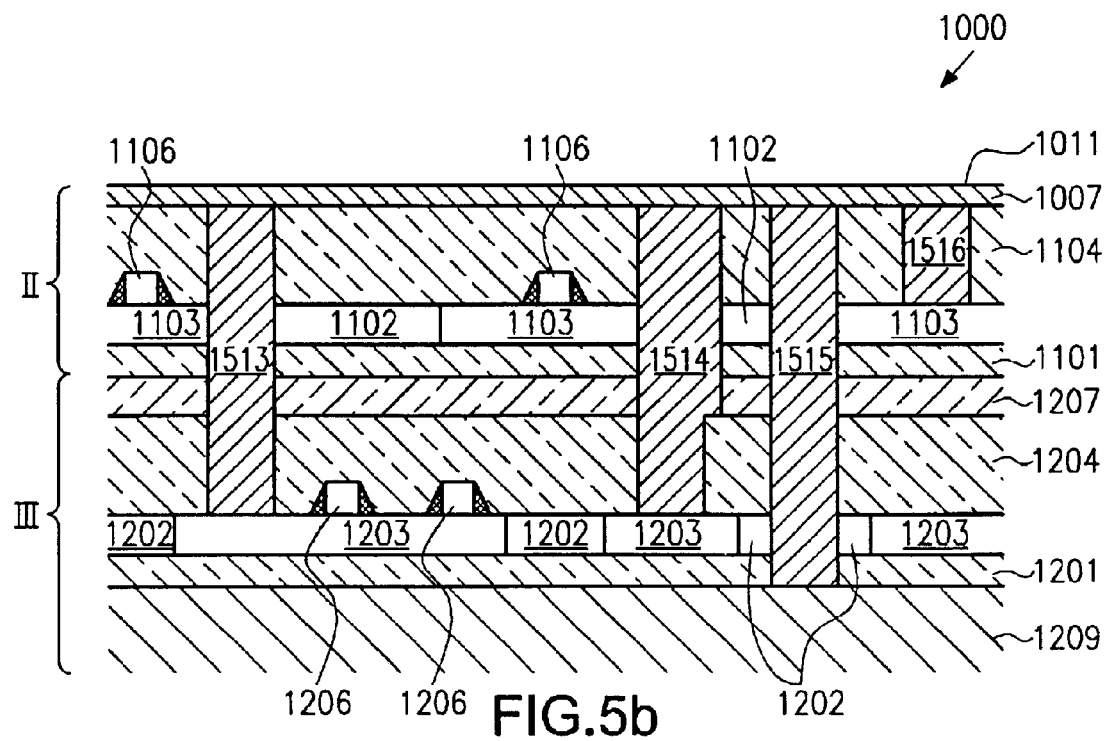

FIG. 5b is a cross-sectional view of a first device member 1000 formed on a substrate 1209, whereby the first device member 1000 comprises at least two circuits II and III stacked on top of each other and fused together, first contact portions 1513, 1514, 1515, 1516 extending through the fused circuits II, III and a first planar insulating layer 1007 of dielectric material having a first free surface 1011. The first circuit II comprises circuit elements 1106, semiconductor films 1103 and insulating films 1101 and 1102. The second circuit III comprises circuit elements 1206, semiconductor films 1203 and insulating films 1201 and 1202.

The structure of the first device member 1000 in this illustrative embodiment is analogous to the semiconductor device 500 of FIG. 1e, however, without the contact pads 508. Therefore, all features described with reference to FIGS. 1a–1e and corresponding embodiments also apply to FIG. 5b.

Figure 5C:
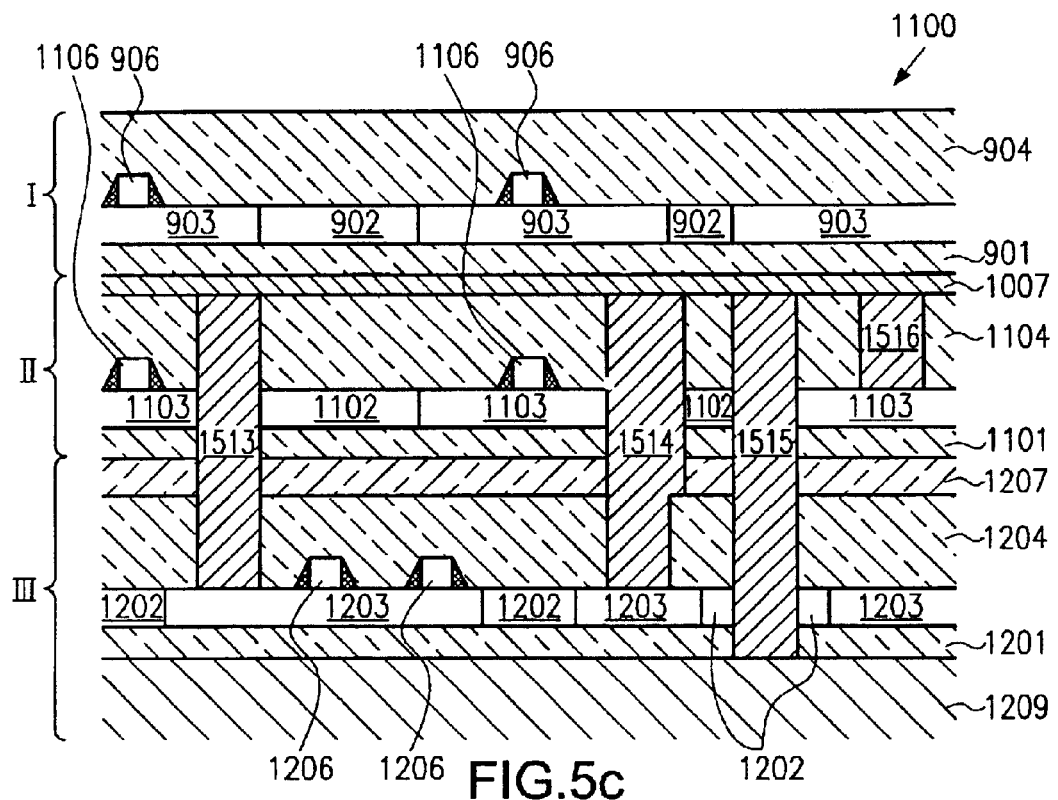

FIG. 5c shows a process stage of a semiconductor device 1100 wherein the second device member 900 is stacked on top of the first device member 1000 and fused by a bonding process that may be analogous to the bonding process described with FIG. 1c. Therefore, all embodiments described therein may be applied.

Figure 5D:
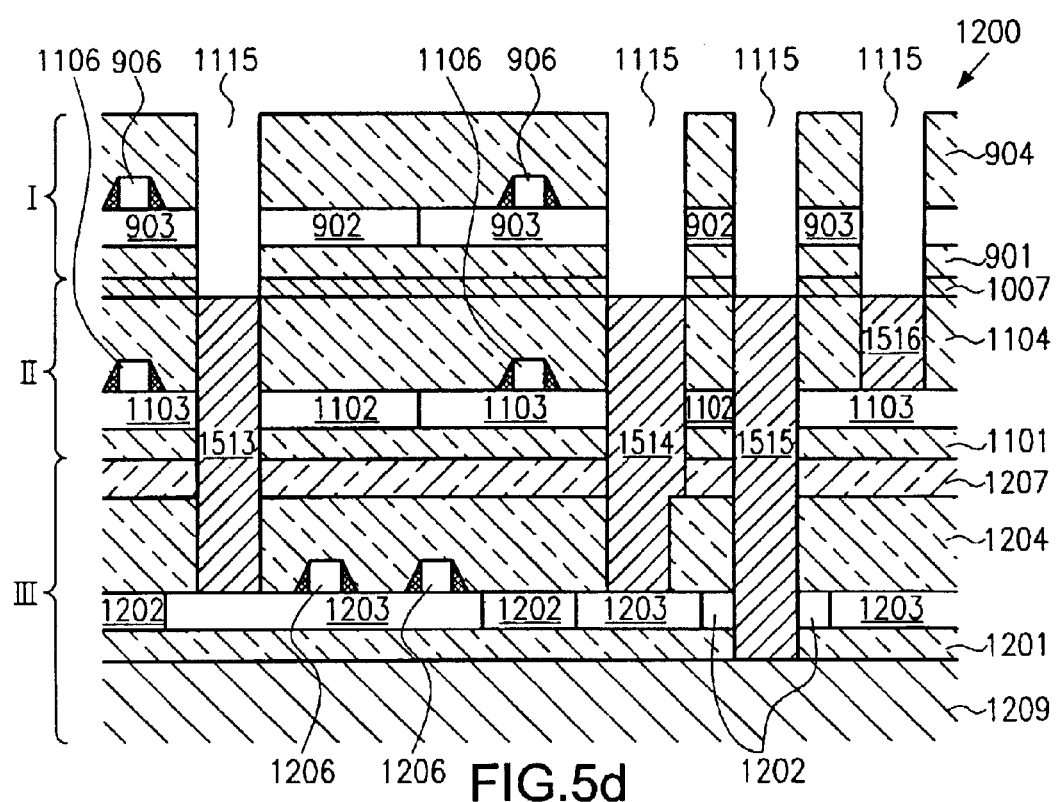

FIG. 5d illustrates a process stage of a semiconductor device 1200 wherein vias 1115 are etched into the semiconductor device 1200, particularly into the second device member 900 down to the contact portions 1513, 1514, 1515, 1516 of the underlying first device member 1000. The diameter of the vias 1115 may be slightly larger than the underlying contact portions 1513, 1514, 1515, 1516 to facilitate alignment (not shown).

Figure 5E:
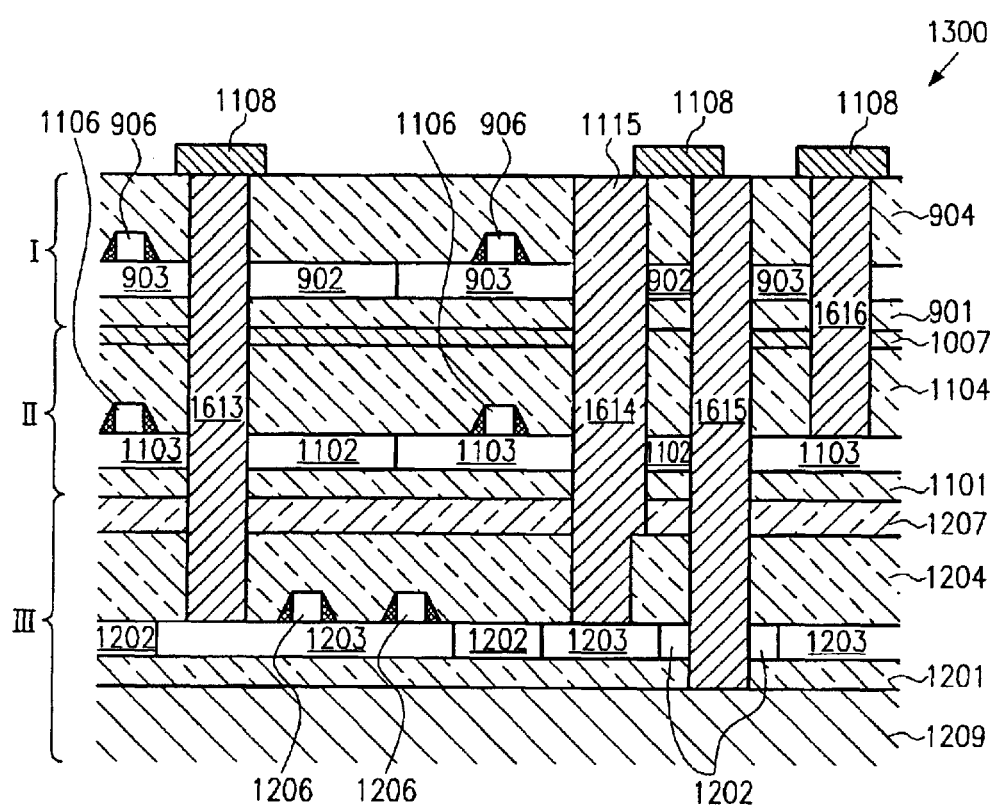

FIG. 5e is a cross-sectional view of the complete three-dimensional integrated semiconductor device 1300. The vias 1115 of FIG. 5d are filled with conductive material to complete the contact portions 1613, 1614, 1615, 1616, providing a multi-level interconnection between stacked circuits I, II and III. The vias 614 are filled by any appropriate contact metal known in the art, such as tungsten, aluminum, cobalt, titanium, tantalum or a combination thereof. On top of the contact portions 1613, 1614, 1615, 1616, contact pads 1108 may be formed. The deposition process may be chemical vapor deposition (CVD), sputtering, selective electroless metal deposition from aqueous solutions and the like.

Figure 6A:
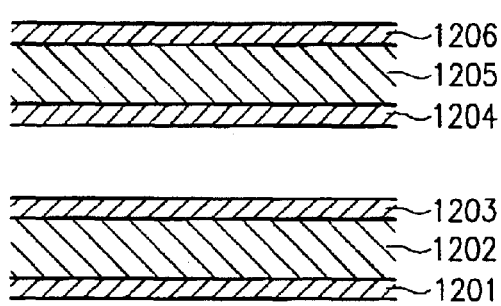
FIGS. 6a–6d show an illustrative embodiment where the bonded silicon on insulator wafer is processed from both sides.

FIGS. 6a–6d schematically show a further fabrication method of an integrated circuit 1400 during various manufacturing stages according to one illustrative embodiment. FIG. 6a shows a cross-sectional view of a first wafer 1202 and a second 1205 wafer, whereby the first and a second wafers 1202, 1205 comprise a doped or undoped semiconductor film 1202, 1205 provided with oxide layers 1201, 1203, 1204 and 1206, respectively. The semiconductor material may be silicon, germanium, gallium arsenide and the like.

Figure 6B:
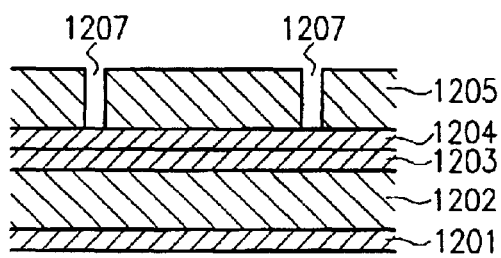

FIG. 6b shows the first and second wafers 1202 and 1205 bonded at the oxide layers 1203 and 1204. A covering oxide layer 1206 is removed and trenches 1207 are formed to define semiconductor islands.

Figure 6C:
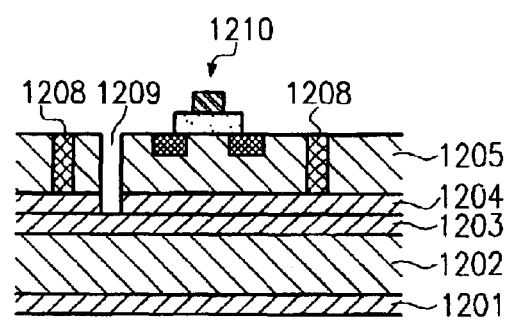

In FIG. 6c, a circuit element 1210, exemplified in this case by a field effect transistor, is formed at least partially in the silicon island. The trenches are filled with dielectric material 1208.

Figure 6D:
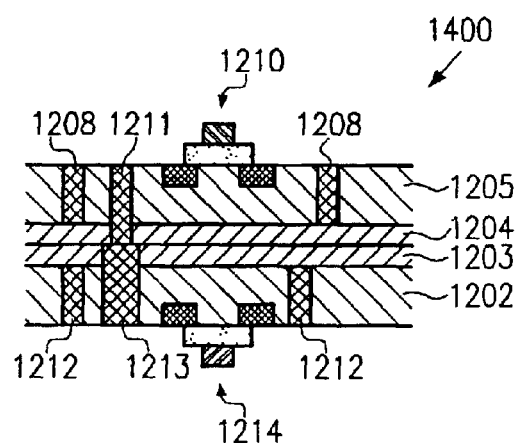

In FIG. 6d, the via 1207 is filled with conductive material 1211. The oxide layer 1201 is removed and trenches 1212 for semiconductor islands are formed and filled. A circuit element 1214 is formed and a via 1213 is etched through the second wafer 1202 to the via 1211 and filled with conductive material.

The processes for forming the three-dimensional integrated circuit 1400 as depicted in FIG. 6d are similar to those described above and the description thereof is omitted.

In a further embodiment (not shown), the three-dimensional integrated circuit 1400 may be used as a first and/or a second device member 100, 200, as described in FIGS. 1a–1e, to form a three-dimensional integrated device comprising three and more layers with circuit elements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a three-dimensional integrated semiconductor device, comprising:

providing a first device member, said first device member comprising a first circuit element formed at least partially in a first semiconductor film, wherein said semiconductor film is formed as a semiconductor island surrounded by insulating material, a first contact portion, and a first planar insulating layer of dielectric material having a first free surface;

providing a second device member, said second device member comprising a second circuit element formed at least partially in a second semiconductor film and a second planar insulating layer of dielectric material formed on the second semiconductor film having a second free surface;

stacking said first and second device members on top of each other such that said first free surface of said first planar insulating layer faces said second free surface of said second planar insulating layer;

bonding said first planar insulating layer and said second planar insulating layer together; and forming a second contact portion extending through said second device member, said second semiconductor layer, said second planar insulating layer and said first planar insulating layer to said first contact portion.

2. The method of claim 1, wherein at least one of said first and second semiconductor films is formed on an isolating substrate by depositing a silicon layer on said substrate.

3. The method of claim 2, wherein at least one of said first and second device members is formed by a process, comprising:

bonding a first semiconductor wafer to a second semiconductor wafer, wherein at least one semiconductor wafer surface is oxidized and the oxidized surface lies between the two semiconductor wafers;

etching one of grooves and trenches in one side of the bonded wafers down to said oxidized surface to define silicon islands;

filling the one of grooves and trenches with insulating dielectric material; and forming circuit elements on said silicon islands.

4. The method of claim 3, wherein said first and said second semiconductor wafers are bonded together at a temperature range from approximately 700–1200° C.

5. The method of claim 3, wherein said first and said second semiconductor wafers are bonded by using the same bonding process as for the bonding of said first and second planar insulating layers of said first and second device members.

6. The method of claim 1, wherein silicon dioxide is used as said dielectric material.

7. The method of claim 1, wherein forming said first contact portion comprises:

etching a via into said first device member through at least two different materials; and filling said via with conductive material.

8. The method of claim 7, wherein said first contact portion comprises a substrate contact providing a conductive path to a substrate on which said first device member is formed.

9. The method of claim 7, wherein an aspect ratio of said via is larger than 10.

10. The method of claim 7, wherein an aspect ratio of said via is larger than 15.

11. The method of claim 7, wherein an anisotropic dry etch process is used to etch said via into said first device member.

12. The method of claim 1, wherein the bonding of said first and said second device comprises:

polishing the first and second free surfaces of the first and the second planar insulating layers;

activating the first and second free surfaces; and bringing said polished first and second free surfaces into close contact.

13. The method of claim 1, wherein said first and said second devices are bonded at a temperature range approximately between room temperature and 500° C.

14. The method of claim 1, wherein said first and said second devices are bonded at a temperature range approximately between room temperature and 300° C.

15. The method of claim 1, wherein forming of said second contact portion comprises:

etching a via extending through said second device member, said second semiconductor layer, said second planar insulating layer and said first planar insulating layer to a first contact portion; and filling said via with a conductive material.

16. The method of claim 15, wherein an aspect ratio of said via is larger than 10.

17. The method of claim 15, wherein an aspect ratio of said via is larger than 15.

18. The method of claim 15, wherein an anisotropic dry etch process is used to etch said via extending through said second device.

19. The method of claim 1, wherein providing said second semiconductor device member further comprises:

depositing a bonding layer on the surface;

attaching a temporary substrate used as supporting layer; and removing a substrate underlying said second planar insulating layer of dielectric material.

20. The method of claim 19, wherein the supporting layer is chosen to be compatible to underlying structures regarding thermal expansion.

21. The method of claim 19, wherein said temporary substrate is removed after bonding said second planar insulating layer to said first planar insulating layer.

22. A method of forming a three-dimensional integrated semiconductor device, comprising:

providing a first semiconductor circuit element, said first semiconductor circuit element comprising a first contact portion and a first planar insulating layer of dielectric material covering said first semiconductor circuit element and said first contact portions and having a first free surface;

providing a second semiconductor circuit element formed on a second planar insulating layer of dielectric material having a second free surface;

stacking said first and said second semiconductor circuit elements on top of each other such that said first free surface of said first planar insulating layer faces said second free surface of said second planar insulating layer;

bonding said first planar insulating layer and said second planar insulating layer together; and forming a second contact portion extending through said second semiconductor circuit element, said second planar insulating layer and said first planar insulating layer to a first contact portion by etching a via having an aspect ratio greater than 10 and filling it with conductive material.

23. The method of claim 22, wherein an aspect ratio of said via is larger than 15.

24. The method of claim 22, wherein at least one of said first and second semiconductor circuit elements is formed on and in a silicon layer deposited on an insulating substrate.

25. The method of claim 24, wherein at least one of said first and said second semiconductor circuit elements is formed by a process comprising:

bonding a first semiconductor wafer to a second semiconductor wafer, wherein at least one semiconductor wafer surface is oxidized and the oxidized surface lies between the two semiconductor wafers;

etching one of grooves and trenches in one side of the bonded wafers down to said oxidized surface to define silicon islands;

filling the one of grooves and trenches with insulating dielectric material; and forming circuit elements on said silicon islands.

26. The method of claim 25, wherein said first and said second semiconductor wafers are bonded together at a temperature ranging from approximately 700–1200° C.

27. The method of claim 25, wherein said first and said second semiconductor wafers are bonded together by using the same bonding process as for the bonding of said first and second planar insulating layers of said first and second semiconductor circuit elements.

28. The method of claim 22, wherein silicon dioxide is used as said dielectric material.

29. The method of claim 22, wherein forming said first contact portion comprises:

etching a via into said first device member through at least two different materials; and filling said via with conductive material.

30. The method of claim 29, wherein said first contact portion comprises a substrate contact providing a conductive path to a substrate on which said first semiconductor circuit element is formed.

31. The method of claim 29, wherein an aspect ratio of said via is larger than 10.

32. The method of claim 29, wherein an aspect ratio of said via is larger than 15.

33. The method of claim 29, wherein an anisotropic dry etch process is used to etch said via into said first device.

34. The method of claim 22, wherein the bonding of said first and said second devices comprises:

polishing the first and second free surfaces of the first and the second planar insulating layers;

activating the first and second free surfaces; and bringing said polished first and second free surfaces into close contact.

35. The method of claim 34, wherein said first and said second devices are bonded together at a temperature range approximately between room temperature and 500° C.

36. The method of claim 34, wherein said first and said second devices are bonded together at a temperature range approximately between room temperature and 300° C.

37. The method of claim 22, wherein providing said second semiconductor circuit element further comprises:
depositing a bonding layer on the surface;
attaching a temporary substrate used as a supporting layer; and
removing a substrate underlying said second planar insulating layer of dielectric material.

38. The method of claim 37, wherein the supporting layer is chosen to be compatible to underlying structures regarding thermal expansion.

39. The method of claim 38, wherein said temporary substrate is removed after bonding said second planar insulating layer to said first planar insulating layer.

40. A method of forming a three-dimensional integrated semiconductor device, comprising:
providing a first semiconductor device element, said first semiconductor device element comprising at least two circuit elements stacked on top of each other and fused together, a first contact portion and a first planar insulating layer of dielectric material having a first free surface;
providing a second semiconductor device element formed on a second planar insulating layer of dielectric material having a second free surface;
stacking said first and said second semiconductor device elements on top of each other such that said first free surface of said first planar insulating layer faces said second free surface of said second planar insulating layer;
bonding said first planar insulating layer and said second planar insulating layer together; and
forming a second contact portion extending through said second semiconductor device element, said second planar insulating layer and said first planar insulating layer to said first contact portion by etching at least one via having an aspect ratio greater than 10 and filling it with conductive material.

41. The method of claim 40, wherein at least one of said circuit elements is formed in and on a silicon layer deposited on an insulating substrate.

42. The method of claim 40, wherein at least one of said first and second semiconductor device elements is formed in and on a silicon layer deposited on an insulating substrate.

43. The method of claim 40, wherein silicon dioxide is used as said dielectric material.

44. The method of claim 40, wherein forming one of said first and said second contact portions comprises:
etching a via through at least two different materials; and
filling said via with conductive material.

45. The method of claim 44, wherein one of said first and said second contact portions comprises a substrate contact providing a conductive path to a substrate on which one of said first and said second semiconductor device elements is formed.

46. The method of claim 44, wherein an aspect ratio of said via is larger than 15.

47. The method of claim 40, wherein the bonding of said first and said second devices comprises:
polishing the first and second free surfaces of the first and the second planar insulating layer;
activating the first and second free surfaces; and
bringing said polished first and second free surfaces into close contact.

48. The method of claim 47, wherein said first and said second devices are bonded together at a temperature range approximately between room temperature and 500° C.

49. The method of claim 47, wherein said first and said second devices are bonded together at a temperature range approximately between room temperature and 300° C.

50. A method of forming a three-dimensional integrated semiconductor device, comprising:
providing a first semiconductor film with a first planar insulating layer of dielectric material having a first free surface;
providing a second semiconductor film with a second planar insulating layer of dielectric material having a second free surface;
stacking said first and said second semiconductor films on top of each other such that said first free surface of said first planar insulating layer faces said second free surface of said second planar insulating layer and such that the first and the second semiconductor films are separated by the first and the second planar insulating layers;
bonding said first planar insulating layer and said second planar insulating layer together;
forming a circuit element at least partially in each of said first and second semiconductor films; and
forming a contact portion by etching a via having an aspect ratio greater than 10 and filling it with conductive material.

51. The method of claim 50, wherein at least one of said circuit elements is formed in and on a silicon layer deposited on an insulating substrate.

52. The method of claim 50, wherein silicon dioxide is used as said dielectric material.

53. The method of claim 50, wherein forming said contact portion comprises:
etching a via through at least two different materials; and
filling said via with conductive material.

54. The method of claim 53, wherein said contact portion comprises a substrate contact providing a conductive path to a substrate on which said circuit element is formed.

55. The method of claim 53, wherein said contact portion provides an interconnection between first and second circuit elements of said first and second semiconductor films.

56. The method of claim 53, wherein an aspect ratio of said via is larger than 15.

57. The method of claim 50, wherein the bonding of said first and said second planar insulating layers comprises:
polishing the first and second free surfaces of the first and the second planar insulating layers;
activating the first and second free surfaces; and
bringing said first and second free polished surfaces into close contact.

58. The method of claim 57, wherein said first and said second devices are bonded together at a temperature range approximately between room temperature and 500° C.

59. The method of claim 57, wherein said first and said second devices are bonded together at a temperature range approximately between room temperature and 300° C.

* * * * *